US006041168A

United States Patent [19]

Hasegawa

[11] Patent Number: 6,041,168

[45] Date of Patent: *Mar. 21, 2000

[54] HIGH-SPEED DELAY VERIFICATION APPARATUS AND METHOD THEREFOR

[75] Inventor: Takumi Hasegawa, Tokyo, Japan

[73] Assignee: NEC Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/771,247

[22] Filed: Dec. 20, 1996

[30] Foreign Application Priority Data

Dec. 27, 1995 [JP] Japan .................................... 7-340069

[51] Int. Cl.[7] ........................................ G06F 17/50

[52] U.S. Cl. ........................................ 395/500.07

[58] Field of Search .................................... 364/488, 489, 364/490, 491, 578

[56] References Cited

U.S. PATENT DOCUMENTS

| | | | |
|---|---|---|---|
| 5,258,919 | 11/1993 | Yamanouchi | 364/489 |
| 5,508,937 | 4/1996 | Abato et al. | 364/488 |
| 5,535,145 | 7/1996 | Hathaway | 364/578 |
| 5,617,325 | 4/1997 | Schaefer | 364/488 |

FOREIGN PATENT DOCUMENTS 4337870 11/1992 Japan .

*Primary Examiner*—Kevin J. Teska
*Assistant Examiner*—Thuan Do
*Attorney, Agent, or Firm*—McGinn & Gibb, P.C.

[57] ABSTRACT

A high-speed delay verification apparatus and method includes a tracing device for respectively tracing a circuit in input (fan-in) and output (fan-out) directions thereof, based on the circuit information stored in a delay model storage device. The tracing device obtains the maximum value of the delay time of each node. The tracing device further sums the maximum values of the delay times obtained, and adds the sum of the maximum value of the delay time obtained for each node to circuit information of the delay model storage device to store it into an additional model storing device. A limit inspecting device deletes, based on the information stored in the additional model storing device, the node and its arc in which the sum of the maximum value of the delay time is less than the limit value of the delay time of the limit value storing device from the information stored in the additional model storing device and then stores such node and arc information in a modified model storage device. The limit inspecting device may also delete, based on the information stored in the additional model storing device, the node and its arc in which the sum of the minimum value of the delay time is greater than a second limit value and then store such node and arc information in the modified model storage device. A delay verification device verifies the delay based on the circuit information of a modified model storing device. Thus, the delay verification can be performed at high-speed.

20 Claims, 2 Drawing Sheets

DELAY MODEL STORING MEANS (1)

LIMIT VALUE STORING MEANS (4)

TRACING MEANS (2)

ADDITIONAL MODEL STORING MEANS (3)

LIMIT INSPECTING MEANS (5)

MODIFIED MODEL STORING MEANS (6)

DELAY VERIFICATION MEANS (7)

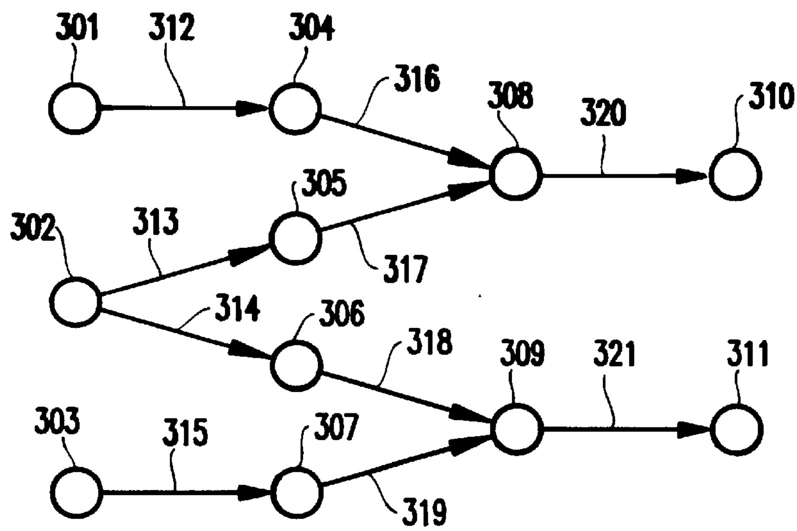
FIG.3
| ARC | DELAY TIME |
|---|---|
| 312 | 5 |
| 313 | 3 |
| 314 | 4 |
| 315 | 3 |
| 316 | 3 |
| 317 | 3 |
| 318 | 4 |
| 319 | 3 |
| 320 | 3 |
| 321 | 3 |
FIG.4
| ARC | DELAY TIME |
|---|---|
| 301 | 11 |
| 302 | 11 |
| 303 | 9 |
| 304 | 11 |
| 305 | 9 |
| 306 | 11 |
| 307 | 9 |
| 308 | 11 |
| 309 | 11 |
| 310 | 11 |
| 311 | 11 |
FIG.5
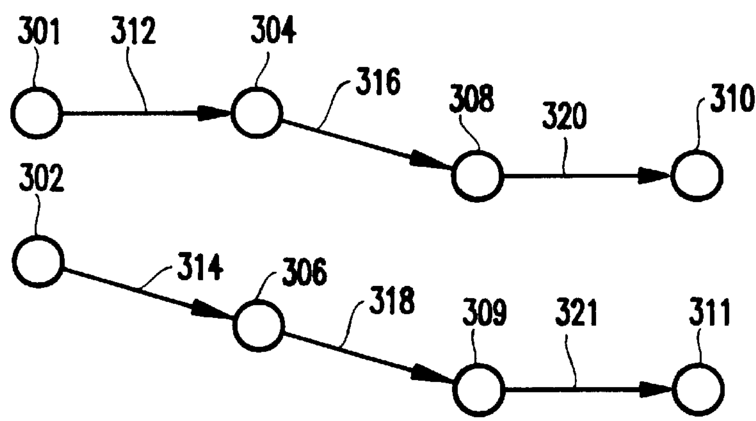
FIG.6

HIGH-SPEED DELAY VERIFICATION APPARATUS AND METHOD THEREFOR

BACKGROUND OF THE INVENTION

The present invention generally relates to a high speed delay verification apparatus and method, and more particularly to a delay verification system and a method for verifying delay of a logic circuit.

DESCRIPTION OF THE RELATED ART

A conventional delay verification system verifies all paths included in a logic circuit (e.g., the verification object), by calculating the delay times of each of the paths considering clock skew and other delay causing factors.

In the conventional systems, all paths existing between the input terminal and the output terminal of the logic circuit are verified and the delay time of each path is determined when the circuit is verified. Typically, delay verification is only used during the testing and development of a circuit. After the delay times are verified, they are then "approved" or "disapproved" by comparing them with a predetermined limit. For example, if the delay time must be at least 5 ns, then only those paths that have a delay time of at least 5 ns are approved.

A conventional method of delay verification is disclosed in Japanese Patent Laid-Open No. 337870/1992 in which the delay verification of each path is executed each time a circuit is tested. For example, the verification method could be executed after a design change in the paths of the logic circuit. In such a conventional system, the approval status of the paths is determined after the delay times are verified based on whether each path's delay time exceeds the design reference value. Therefore, according to the conventional systems all paths are verified before they are approved or disapproved.

Thus, the unaltered part delay time calculation means 4 calculates the unaltered portion of the path, the unaltered part delay time storage means 5 stores the unaltered portions, and the alteration information storage means 6 stores the information regarding the altered portion of the path. Hence, in the conventional system, just the altered portions of the circuit are verified for delay time by storing information of which paths were altered. The more altered portions which are present, the more processing time is required.

SUMMARY OF THE INVENTION

In view of the foregoing problems of the conventional systems, an object of the present invention is to provide a high speed delay verification apparatus and method which solves the above problems and which shortens the delay verification time, and thereby achieves a time-efficient delay verification system.

According to a first aspect of the present invention, a high-speed delay verification apparatus for verifying the delay of a logic circuit, includes delay model storing means for storing information of a circuit model including logic information, connecting information and delay information of the logic circuit as the verification object, tracing means for respectively calculating, for each pin (e.g., circuit element and external terminal pins) of the logic circuit, a delay time from each pin to a starting point within the logic circuit and a delay time from each pin to an ending point within the logic circuit based on the contents of the delay model storing means, limit inspecting means for deleting, from a contents of the delay model storing means, information regarding the pin for which a sum of the delay time up to the starting point and the delay time up to the ending point calculated by the tracing means is less than the preset limit value, and delay verifying means for verifying delay of the logic circuit based on contents of the delay model storing means from which the information regarding the pin less than the limit value and connection thereof is deleted by the limit inspecting means.

In a second aspect of the present invention, the tracing means preferably outputs, for each node (e.g., pin), a sum of the maximum value among the delay times up to the starting point obtained by tracing delay times from each pin up to the starting point and the maximum value among the delay times up to ending point obtained by tracing up to the ending point from each pin.

In yet another aspect of the present invention, the limit inspecting means preferably includes means for extracting information regarding the node (pin) for which a sum of the maximum value among the delay times to the starting point and the maximum value among the delay times to the ending point is less than the limit value, and for deleting information extracted regarding the pin from contents of the delay model storing means.

Preferably, a limit value storing means also is provided for previously storing the limit value.

Additional model storing means is provided preferably for storing a tracing result of the tracing means.

With the unique and unobvious structure and method of the present invention, the delay verification time can be shortened when compared to the conventional methods and apparatus. High-speed delay verification can be achieved by calculating the delay time from each pin up to the starting point of the logic circuit and the delay time from each pin up to the ending point based on the information of the circuit model such as the logic information, connecting information and delay information.

Thereafter, delay verification is performed on the circuit by verifying each node (e.g., pin), based on the information of the circuit model, and deleting nodes for which the sum of the delay time up to the starting point and the delay time up to the ending point is less than the preset limit value.

Essentially, the invention approves or disapproves nodes prior to the verification process based on whether the time delay of a node is below a predetermined limit (or, as described in the second embodiment of the invention, if the time delay of the node is greater than a second predetermined limit). By only verifying approved nodes, the invention shortens the verification process when compared to conventional verification processes and allows the system to operate more efficiently.

BRIEF DESCRIPTION OF THE DRAWINGS

The foregoing and other objects, aspects and advantages will be better understood from the following detailed description of a preferred embodiment of the invention with reference to the drawings, in which:

FIG. 3 illustrates a delay model of the logic circuit shown in FIG. 2;

FIG. 4 illustrates an example of the delay time corresponding to the arcs stored in a delay model storing means 1 of FIG. 1;

FIG. 5 illustrates sums of the maximum value of the delay time of each node calculated based on the delay time of FIG. 4; and FIG. 6 illustrates a delay model of the logic circuit modified based on the sum of the maximum values of the delay times of FIG. 5.

DETAILED DESCRIPTION OF PREFERRED EMBODIMENTS OF THE INVENTION

Figure 1:
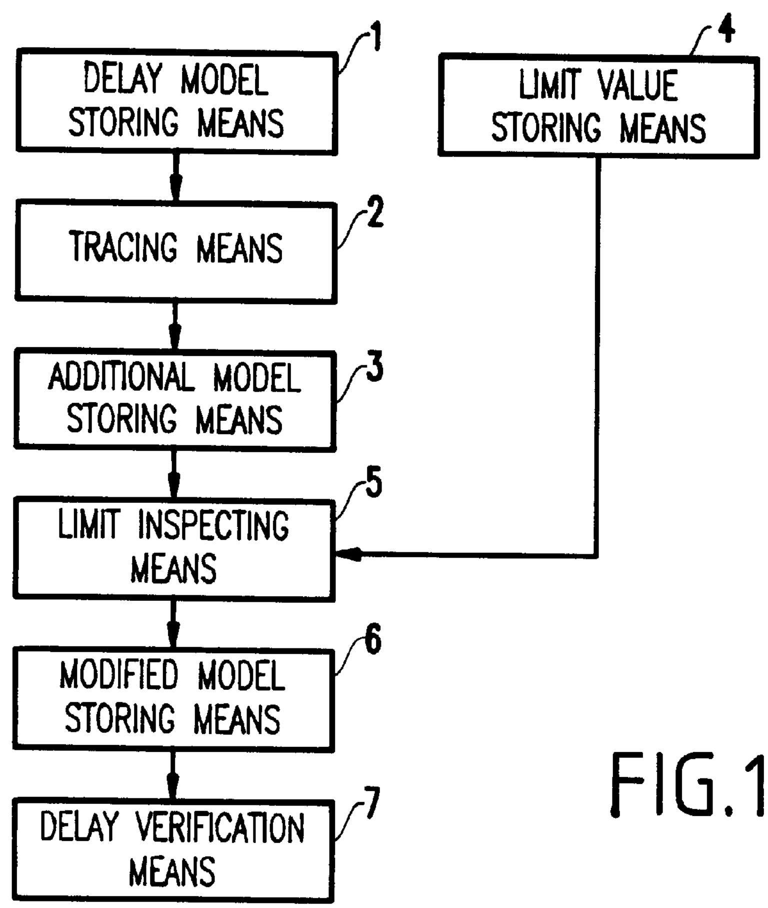
FIG. 1 is block diagram illustrating a first embodiment of a high-seed delay verification apparatus according to the present invention.

Referring now to the drawings, and more particularly to FIG. 1, a first preferred embodiment of the high-speed delay verification apparatus of the present invention will be explained.

Generally, the high-speed delay verification apparatus may be implemented with a general-purpose computer, a workstation or the like including a disk storage unit and suitable software. No special programming language is required.

The high-speed delay verification apparatus includes delay model storing means 1, tracing means 2, additional model storing means 3, limit value storing means 4, limit inspecting means 5, modified model storing means 6, and a delay verification means 7.

Figure 2:
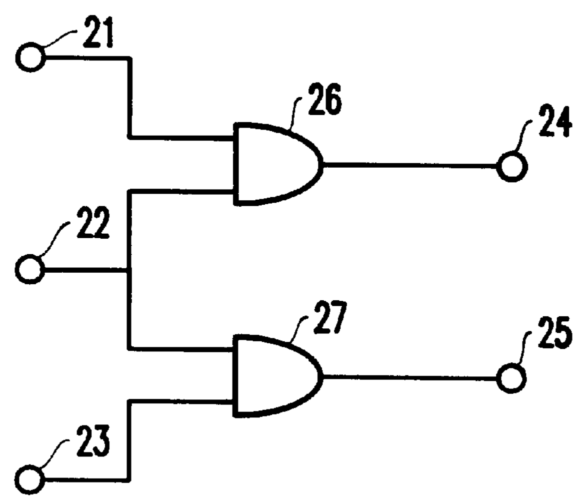
FIG. 2 illustrates an exemplary logic circuit, as the object of delay verification, depending on the embodiment of the present invention.

External pins and circuit element pins of the logic circuit (21–27; FIG. 2) are considered nodes (301–311; FIG. 3) of the circuit. Signal flow between such nodes is defined as arcs (312–321; FIG. 3). The series of nodes and arcs form "paths" from an input node to an output node. Delay model storing means 1 stores circuit information (i.e., a model of the circuit) including arc information and delay information representing the delay time of each of the arcs within the circuit element. The delay model storing means is formed preferably by a storage device including for example a magnetic or optical disk media. As known by one of ordinary skill in the art, the delay information representing respective delay times is found in a known manner.

Tracing means 2 respectively traces the circuit in input and output directions of a signal based on the circuit information stored in the delay model storing means 1. The tracing means is preferably implemented in software, but could of course also be implemented in hardware.

The tracing means 2 obtains the maximum values of the delay time from a node (the "object node") up to the external output pin and of the delay time from the node up to the input pin (e.g., of a latch and flip-flop). The "maximum" time delay value for a node is the path from the node to the input and output of the circuit which results in the greatest time delay.

The tracing means 2 totals the maximum values of the delay times obtained. As mentioned above, the tracing means 2 is implemented preferably in software.

The additional model storing means 3 receives the sum of the maximum values of the delay times of respective nodes from the tracing means 2 (e.g., the model created by the tracing means 2) and adds this data to the circuit information stored in the delay model storing means 1 to create another model of the circuit. The additional model storing means 3 is preferably formed of a storage device including a magnetic (e.g., hard disk or removable floppy disk) and/or optical media.

Therefore, the delay model storing means 1 stores information as to the different arcs and their individual delay times. In contrast, the additional model storing means 3 stores information of the total delay time between input and output nodes based on the total delay time associated with each path of nodes and arcs (referred to as the "total maximum node delay time) as determined by the tracing means 2.

A predetermined time limit is stored in the limit value storing means 4. Nodes which have total maximum node delay times which are equal to or greater than the predetermined limit value are "approved", while nodes which have total maximum node delay times which are less than this limit are "disapproved". The limit value storing means 4 preferably is formed by a storage device including a magnetic (e.g., hard disk or removable floppy disk) and/or optical media.

The limit inspecting means 5 compares the total maximum node delay times for each node (which is stored in the additional model storing means 3) with the predetermined time limit value (which is stored in the limit value storing means 4) to determine whether the total time limit is equal to or greater than the predetermined time limit.

As discussed above, if the total maximum node delay time of a node is equal to or greater than the predetermined time limit, the limit inspecting means 5 determines that such a node is "approved" and should be subject to the verification process, as discussed below. If the total maximum node delay time of a node is less than the predetermined time limit, the limit inspecting means 5 determines that such a node is "disapproved" and saves processing time by not verifying the disapproved node. The limit inspecting means 5 then deletes the "disapproved" nodes. The limit inspecting means 5 preferably is implemented in software.

That is, when the total of the delay time of a node is less than the predetermined time limit, the limit inspecting means 5 judges that subsequent delay verification of such a disapproved node is unnecessary, and deletes the information relating to that disapproved node from the model to form a modified circuit model.

The modified model storing means 6 stores the circuit information of the delay model storing means 1 modified by the limit inspecting means 5. In other words, modified model storing means 6 contains information only about the approved nodes. The modified model storing means 6 preferably is formed by a magnetic (e.g., hard disk or removable floppy disk) and/or optical media.

The delay verification means 7 verifies the circuit delay based on the approved nodes stored within the modified model storing means 6. The delay verification means 7 preferably is implemented in software. Generally, the delay verification procedure as known by one of ordinary skill in the art involves searching respective nodes (and paths associated with the nodes), calculating delay times about respective nodes/paths, and comparing the values calculated with predetermined values. The delay verification means 7 performs a function similar to that of the delay verification set forth in Japanese 92/337870. However, the invention differs from the conventional system in the processing steps performed before the actual delay verification procedure is performed.

FIG. 2 illustrates an example of a logic circuit which is an object of verification of a first embodiment of the present invention. The logic circuit shown in FIG. 2 includes external input pins 21 to 23, external output pins 24, 25 and circuit elements (logical product (AND) circuits) 26, 27.

More specifically, external pin 21 provides an input to AND gate 26, whereas external pin 22 provides an input to AND gate 26 and to AND gate 27. AND gate 27 also receives an input from external pin 23. AND gates 26 and 27 performed a logical AND operation on the respective inputs and provide outputs to output pins 24, 25, respectively.

FIG. 3 illustrates a delay model of the logic circuit shown in FIG. 2. In FIG. 3, nodes 301–303 respectively correspond to external input pins 21–23, nodes 304–309 respectively correspond to pins of the circuit elements 26, 27, and nodes 310, 311 respectively correspond to external output pins 24, 25.

Arcs 312–321 respectively indicate the signal flow through the external input pins 21 to 23, the circuit elements 26, 27 and ultimately to external output pins 24, 25. Therefore, the delay model storing means 1 stores delay times and connection information corresponding to 10 arcs (e.g., 312–321) and 11 nodes (301–311).

FIG. 4 illustrates exemplary delay times (e.g., typically in units of nanoseconds) of each of the individual arcs 312–321 stored in the delay model storing means 1 of FIG. 1.

FIG. 5 illustrates a total of the maximum values of the delay times of the nodes 301–311. For example, a delay time of a signal from node 301 along arc 312 (having a delay time of 5) to node 304, then along arc 316 (having a delay time of 3) to node 308, and finally along arc 316 (having a delay time of 3) to output node 310 would have a value of 11. This delay time calculation is discussed in further detail below.

In FIG. 5, the total maximum node delay times for each node is listed and represents the sum of the fan-in time and the fan-out time of the respective nodes. For example, the sum of the fan-in time and the fan-out time is equal to 11 for all nodes along a specific path (e.g., 301–310), and thus have the same total maximum node delay time. Hence, each of nodes 301, 304, 308 and 310 have the same total maximum node delay time (i.e., 11) because each lies on the path 301–310. Therefore, certain nodes are disapproved (i.e., nodes 303, 305 and 307) or approved based on their maximum node delay time.

FIG. 6 illustrates a delay model of the logic circuit modified by the sum of the maximum values of the delay times in FIG. 5.

The delay verification processing operation of a first embodiment of the present invention will be explained with reference to FIGS. 1–6.

First, the tracing means 2 obtains the maximum value of the delay times of nodes 301–311 based on the circuit information stored in the delay model storing means 1. For example, the tracing means may obtain the maximum values by software processing in a manner known by one of ordinary skill in the art within the purview of the present application.

The tracing means 2 also calculates a total of the maximum values of delay times and adds the total of the maximum values of the delay times to the circuit information obtained from the delay model storing means 1.

Namely, the tracing means 2 first selects node 301 as the object, and then traces from node 301 to node 310. When the path node 301 node 304 node 308 node 310 is obtained, the tracing means 2 obtains the maximum value of the delay times based on the delay times corresponding to the arcs 312–321 shown in FIG. 4.

Specifically, since there is only one possible path between node 310 and node 301, a sum of the arcs 312, 316 and 320 forming the path is equal to the maximum value of the delay times as indicated hereafter.

Arc 312+Arc 316+Arc 320=5+3+3=11

As discussed above, the maximum time delay value of a node includes the time delay of the arcs on the input and output side of the node. Since node 301 corresponds to the external input pin 21, the maximum value of the delay time of this node 301 is equal to the delay of the arcs from node 301 to node 310 which, in this example, is "11". The value "11" is stored in the additional model storing means 3 corresponding to node 301 as shown in FIG. 5.

When tracing means 2 selects node 302 as the object node, it traces twice, once from node 302 to node 310 and once from node 302 to node 311. Since two paths are provided between node 302 and nodes 310, 311, the path having the greatest time delay is determined to be the maximum value of delay time for node 302. Namely, since Arc 313+Arc 317+Arc 320=3+3+3=9;and Arc 314+Arc 318+Arc 321=4+4+3=11, the sum "11" of the arcs 314, 318, 321 becomes the maximum value of the delay time.

Here, since node 302 corresponds to the external input pin 22, once again the maximum value of the delay time of node 302 is equal to the path from node 302 to node 311 which is equal to "11." Again, "11" is stored in the additional model storing means 3 corresponding to node 302.

When the tracing means 2 selects node 303 as the object node, tracing means 2 traces from node 303 to node 311 and obtains the maximum value of the delay time based on the delay times corresponding to the arcs 312 to 321 shown in FIG. 4.

Again, since only one path is possible between node 303 and node 311, a sum of the arcs 315, 319, and 321 becomes the maximum value of the delay time.

Arc 315+Arc 319+Arc 321=3+3+3=9.

Again, since node 303 corresponds to the external input pin 23 the maximum value of the delay time of this node 303 is equal to the path 303–311 which is "9". The value "9" is stored in the additional model storing means 3 corresponding to node 303 as shown in FIG. 5.

When the tracing means 2 selects node 304 as the object node, the tracing means traces two paths one from node 304 to node 310 and one from node 304 to node 301. Tracing means 2 totals the arc time delays from the two paths to arrive at a total maximum time delay value for this node. In this example, the two paths have the following delay times.

Arc 316+Arc 320=3+3=6

Arc 312=5

Therefore, the maximum value of the delay time of this node 304 becomes 11 (=6+5). The value "11" is stored in the additional model storing means 3 corresponding to node 304.

The tracing means similarly traces paths from the remaining nodes to determine the total maximum delay time associated with each node.

Specifically, with respect to node 305, a path is traced from 305 to 310 which results in a time delay of 6 (i.e., Arc 317+Arc 320=3+3=6) and a path is traced from node 305 to 302 which results in a time delay of 3 (i.e., Arc 313=3). Therefore, node 305 has a total maximum time delay value of 9 (i.e., 6+3=9) and 9 is stored in the additional model storing means 3 corresponding to node 305.

With respect to node 306, a path is traced from 306 to 311 which results in a time delay of 7 (i.e., Arc 318+Arc 321=4+3=7) and a path is traced from node 306 to 302 which results in a time delay of 4 (i.e., Arc 314=4). Therefore, node 306 has a total maximum time delay value of 11 (i.e., 7+4=11) and 11 is stored in the additional model storing means 3 corresponding to node 306.

With respect to node 307, a path is traced from 307 to 311 which results in a time delay of 6 (i.e., Arc 319+Arc 321=3+3=6) and a path is traced from node 307 to 303 which results in a time delay of 3 (i.e., Arc 315=3). Therefore, node 307 has a total maximum time delay value of 9 (i.e., 6+3=9) and 9 is stored in the additional model storing means 3 corresponding to node 307.

With respect to node 308, a path is traced from node 308 to 310 which results in a time delay of 3 (i.e., Arc 320=3), a path is traced from 308 to 301 which results in a time delay of 8 (i.e., Arc 316+Arc 312=3+5=8) and a path is traced from 308 to 302 which results in a time delay of 6 (i.e., Arc 317+Arc 313=3+3=6). The combination of path 308–310 and 308–301 yields a total of 11 (i.e., 3+8=11) and the combination of paths 308–310 and 308–302 yields a total of 9 (i.e., 3+6=9). Therefore, the combination of paths 308–310 and path 308–301 is the maximum time delay value. Therefore, node 308 has a total maximum time delay value of 11 and 11 is stored in the additional model storing means 3 corresponding to node 308.

With respect to node 309, a path is traced from node 309 to 311 which results in a time delay of 3 (i.e., Arc 321=3), a path is traced from 309 to 302 which results in a time delay of 8 (i.e., Arc 318+Arc 314=4+4=8) and a path is traced from 309 to 303 which results in a time delay of 6 (i.e., Arc 319+Arc 315=3+3=6). The combination of path 309–311 and 309–302 yields a total of 11 (i.e., 3+8=11) and the combination of path 309–310 and 309–303 yields a total of 9 (i.e., 3+6=9). Therefore, the combination of path 309–311 and path 309–302 is the maximum time delay value. Therefore, node 309 has a total maximum time delay value of 11 and 11 is stored in the additional model storing means 3 corresponding to node 309.

With respect to node 310, a path is traced from 310 to 301 which results in a time delay of 11 (i.e., Arc 320+Arc 316+Arc 312 =3+3+5=11) and a path is traced from node 310 to node 302 which results in a time delay of 9 (i.e., Arc 320+Arc 317+Arc 313 =3+3+3=9). Therefore, path 310–301 is the maximum time delay value. Therefore, node 310 has a total maximum time delay value of 11 and 11 is stored in the additional model storing means 3 corresponding to node 310.

With respect to node 311, a path is traced from 311 to 302 which results in a time delay of 11 (i.e., Arc 321+Arc 318+Arc 314 =3+4+4=11) and a path is traced from node 311 to node 303 which results in a time delay of 9 (i.e., Arc 321+Arc 319+Arc 315 =3+3+3=9). Therefore, path 311–302 is the maximum time delay value. Therefore, node 311 has a total maximum time delay value of 11 and 11 is stored in the additional model storing means 3 corresponding to node 311.

In this example the predetermined delay time limit value is 10 and is stored in the limit value storing means 4 and used by the limit inspecting means 5 to disapprove the nodes having the delay times less than 10. Therefore, the limit inspecting means would disapprove nodes 303, 305, and 307 because their total maximum delay time is 9 which is less than 10.

Therefore, the limit inspecting means 5 deletes the information of nodes 303, 305, and 307 and the arcs 313, 315, 317, and 319 connected to such nodes from the delay model of the logic circuit. Then, the limit inspecting means 5 stores the updated information (e.g., the model having the above information deleted, to form a modified model) to the modified model storing means 6.

As a result, the modified model (circuit information of the modified delay model storing means 1) shown in FIG. 6 is stored in the modified model storing means 6.

The delay verification means 7 performs a delay verification procedure only on the approved nodes (and paths) stored in the modified model storing means 6 (e.g., nodes 301, 302, 304, 306, 308–311 and the arcs 312, 314, 316, 318, 320, 321).

As explained above, since the information of the circuit model (which includes the logic information, connecting information and delay information of the logic circuit) is stored in the delay model storing means 1, the delay time from each node to the starting point in the logic circuit and the delay time from each node to the ending point in the logic circuit are respectively calculated for each node by the tracing means 2.

When the total maximum delay time of a node, as calculated by the tracing means 2, is less than the predetermined limit value, the node is "disapproved" (judged as not having to be verified) from the circuit model by the limit inspecting means 5 and deleted. The delay verification means 7 only verifies the delay of the "approved" nodes (and paths) based on the contents of the modified model stored in the modified model storing means 6.

Therefore, the path portion (node) of the logic circuit which does not require delay verification, because the maximum value of the delay time is less than the limit value, can be deleted in advance from the delay model.

As a result, the time required for delay verification is shortened since less nodes must be checked and verified, as compared to the conventional methods and apparatus. Hence, high-speed delay verification is achieved. Further, less memory is required in the apparatus of the present invention since nodes are deleted from the storing means before actual delay verification. Thus, with the unique and unobvious structure of the present invention, a smaller structure results, and the time consumed by the delay verification is shortened and high-speed delay verification is achieved.

Additionally, besides considering maximum node delay times, delay verification also typically examines minimum node delay times.

Accordingly, in a second embodiment of the present invention, the limit inspecting means deletes, from the contents of the circuit model, information regarding a node for which a sum of the first delay time and the second delay time is greater than a second predetermined value, to produce the modified circuit model to be verified.

Thus, preferably, the limit inspecting means deletes, from the contents of the circuit model, information regarding a node for which a sum of the first delay time and the second delay time is at least one of less than a first predetermined value and greater than a second predetermined value, to produce a modified circuit model to be verified. The second predetermined value is less than the first predetermined value.

Additionally, the above first and second embodiments of the present invention may be stored as a program or process on a computer-readable media, such as a magnetic media (e.g., hard disk or floppy diskette) or an optical media (e.g., CD-ROM), for implementation with, and executable by, a general-purpose computer.

For example, such a media may include a process written thereon, the process being for verifying delay of a circuit including a plurality of nodes, and comprising steps of respectively calculating, for each node of the circuit, a first delay time from each node to a starting point within the circuit and a second delay time from each node to an ending point within the circuit based on contents of a circuit model. Additionally, the process includes deleting, from the contents of the circuit model, information regarding a node for which a sum of the first delay time and the second delay time is at least one of less than a predetermined value and greater than a second predetermined value, to produce a modified circuit model to be verified.

Thus, the invention approves or disapproves nodes prior to the actual delay verification process based on whether the time delay of a path is below a predetermined limit, or above a second predetermined value as in the second embodiment. By only verifying approved nodes, the invention shortens the verification process when compared to conventional delay verification processes and allows the system to operate more efficiently.

While the invention has been described in terms of a several preferred embodiments, those skilled in the art will recognize that the invention can be practiced with modification within the spirit and scope of the appended claims.

Having thus described my invention, what I claim as new and desire to secure by letters patent is as follows:

1. A delay verification apparatus for verifying delay of a circuit including a plurality of nodes, said delay verification apparatus comprising:

tracing means for respectively calculating, for each node of said circuit, a first delay time from each node to a starting point within said circuit and a second delay time from each node to an ending point within said circuit based on contents of a circuit model; and limit inspecting means, to produce a modified circuit model to be verified, for following steps of:

a first deleting operation of deleting a node from the contents of a circuit model, said node having a sum of the first delay time and the second delay time which is less than a first predetermined value;

a second deleting operation of deleting a node from the contents of the circuit model, said node having a sum of the first delay time and the second delay time which is greater than a second predetermined value; and a third deleting operation of deleting a node from the contents of the circuit model, said node having a sum of the first delay time and the second delay time which is less than the first predetermined value and greater than the second predetermined value, the second predetermined value being less than the first predetermined value.

2. A delay verification apparatus according to claim 1, further comprising:

delay model storing means for storing said circuit model of the circuit; and delay verifying means for verifying delay of said circuit based on said contents of said modified circuit model.

3. A delay verification apparatus according to claim 1, wherein said circuit model of said circuit includes logic information, connecting information and delay information of the circuit, and wherein said tracing means includes means for outputting, for each node, a sum of the maximum value among the first delay times, by tracing from each node up to said starting point, and the maximum value among the second delay times, by tracing from each node up to said ending point.

4. A delay verification apparatus according to claim 3, wherein said limit inspecting means includes means for deleting information regarding a node for which said sum is less than said first predetermined value, to produce said modified circuit model, said node for which said sum is less than said first predetermined value being a disapproved node.

5. A delay verification apparatus according to claim 3, wherein said limit inspecting means includes means for deleting information regarding a node for which said sum is greater than said second predetermined value, to produce said modified circuit model, said node for which said sum is greater than said second predetermined value being a disapproved node.

6. A delay verification apparatus according to claim 1, further comprising a limit value storing means for storing said first and second predetermined values.

7. A delay verification apparatus according to claim 1, further comprising an additional model storing means for storing a tracing result of said tracing means.

8. A delay verification apparatus for verifying a delay of a circuit, said circuit including paths, each of said paths including nodes, said nodes having node delays associated therewith, said apparatus comprising:

means for performing one of a first approving operation of approving a node of said nodes if said node has a node delay that is less than a first predetermined delay value, a second approving operation of approving a node of said nodes if said node has a node delay that is greater than a second predetermined delay value, and a third approving operation of approving a node of said nodes if said node has a node delay that is less than the first predetermined delay value or greater than the second predetermined delay value, said second predetermined delay value being less than said first predetermined delay value; and means for verifying said circuit delay based on said approved nodes.

9. A delay verification apparatus as in claim 8, further comprising means, connected to said means for performing, for storing said first and second predetermined delay values.

10. A delay verification apparatus as in claim 8, further comprising:

means, connected to said means for performing, for storing a model of said circuit, wherein said model comprises connection information of said nodes and said node delays.

11. A delay verification apparatus as in claim 10, further comprising means, connected to said means for performing, for storing a modified model of said circuit, wherein said modified model comprises said connection information and said node delays of said approved nodes.

12. A delay verification apparatus as in claim 8, further comprising means, connected to said means for performing, for tracing paths, said paths connecting between a plurality of said nodes and having a first end and a second end.

13. A delay verification apparatus as in claim 12, wherein said tracing means determines a total maximum node delay for each node of said nodes, wherein a first maximum node delay comprises a delay from said node to said first end of a path of said paths containing said node, and a second maximum node delay comprises a delay from said node to said second end of said path, and wherein said total maximum node delay comprises said first maximum node delay added to said second maximum node delay.

14. A delay verification apparatus as in claim 13, wherein said node is positioned on at least two of said paths and said first maximum node delay comprises a largest delay from said node to one of each first end of said at least two paths and said second maximum node delay comprises a largest delay from said node to one of each second end of said at least two paths.

15. A method for verifying delay of a circuit including a plurality of nodes, said method comprising:

respectively calculating, for each node of said circuit, a first delay time from each node to a starting point within said circuit and a second delay time from each node to an ending point within said circuit based on contents of a circuit model; and to produce a modified circuit model to be verified, following steps of:

first deleting operation of deleting a node from the contents of a circuit model, said node having a sum of the first delay time and the second delay time which is less than a first predetermined value;

a second deleting operation of deleting a node from the contents of the circuit model, said node having a sum of the first delay time and the second delay time which is greater than a second predetermined value; and a third deleting operation of deleting a node from the contents of the circuit model, said node having a sum of the first delay time and the second delay time which is less than the first predetermined value and greater than the second predetermined value, said second predetermined value being less than the first predetermined value.

16. A method according to claim 15, further comprising:

storing information of said circuit model; and verifying a delay of said circuit based on said modified circuit model.

17. A method according to claim 16, wherein said storing information includes storing logic information, connecting information and delay information of the circuit, and wherein said calculating includes outputting, for each node, a sum of a first maximum value among the delay times up to said starting point, obtained by tracing from each node up to said starting point, and a second maximum value among the delay times up to said ending point, obtained by tracing from each node up to said ending point, and wherein said calculating further includes outputting, for each node, a sum of a first minimum value among the delay times up to said starting point, obtained by tracing from each node up to said starting point, and a second minimum value among the delay times up to said ending point, obtained by tracing from each node up to said ending point.

18. A method according to claim 17, wherein said deleting includes:

deleting information from said circuit model regarding a node for which a sum of the first maximum value and the second maximum value is less than said first predetermined value, said node being a disapproved node; and deleting information from said circuit model regarding a node for which a sum of the first minimum value and the second minimum value is greater than said second predetermined value, said node being a disapproved node.

19. A method according to claim 16, further comprising storing said first and second predetermined values in advance.

20. A computer-readable media including a process written thereon, said process for verifying delay of a circuit including a plurality of nodes and for being executed by a computer, said process comprising:

respectively calculating, for each node of said circuit, a first delay time from each node to a starting point within said circuit and a second delay time from each node to an ending point within said circuit based on contents of a circuit model; and to produce a modified circuit model to be verified, following steps of:

first deleting operation of deleting a node from the contents of a circuit model, said node having a sum of the first delay time and the second delay time which is less than a first predetermined value;

a second deleting operation of deleting a node from the contents of the circuit model, said node having a sum of the first delay time and the second delay time which is greater than a second predetermined value; and a third deleting operation of deleting a node from the contents of the circuit model, said node having a sum of the first delay time and the second delay time which is less than the first predetermined value and greater than the second predetermined value, said second predetermined value being less than the first predetermined value.

* * * * *